United States Patent
Tran et al.

(10) Patent No.: US 10,460,811 B2
(45) Date of Patent: *Oct. 29, 2019

(54) ARRAY OF THREE-GATE FLASH MEMORY CELLS WITH INDIVIDUAL MEMORY CELL READ, PROGRAM AND ERASE

(71) Applicant: Silicon Storage Technology, Inc., San Jose, CA (US)

(72) Inventors: Hieu Van Tran, San Jose, CA (US); Vipin Tiwari, Dublin, CA (US); Nhan Do, Saratoga, CA (US)

(73) Assignee: Silicon Storage Technology, Inc., San Jose, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 16/387,377

(22) Filed: Apr. 17, 2019

(65) Prior Publication Data

US 2019/0244669 A1    Aug. 8, 2019

Related U.S. Application Data

(63) Continuation of application No. 15/593,231, filed on May 11, 2017, now Pat. No. 10,311,958.

(60) Provisional application No. 62/337,582, filed on May 17, 2016.

(51) Int. Cl.
*G11C 11/34* (2006.01)
*G11C 16/14* (2006.01)
*G11C 16/10* (2006.01)
*G11C 16/04* (2006.01)

(52) U.S. Cl.
CPC .......... *G11C 16/14* (2013.01); *G11C 16/0425* (2013.01); *G11C 16/10* (2013.01)

(58) Field of Classification Search
CPC ........................... G11C 16/0483; G11C 16/10
USPC ..................................................... 365/185.14
See application file for complete search history.

(56) References Cited

U.S. PATENT DOCUMENTS

| | | | |
|---|---|---|---|
| 5,029,130 | A | 7/1991 | Yeh |
| 5,138,576 | A | 8/1992 | Madurawe |
| 5,146,602 | A | 9/1992 | Holler |
| 5,256,911 | A | 10/1993 | Holler |
| 5,264,734 | A | 11/1993 | Holler |

(Continued)

FOREIGN PATENT DOCUMENTS

EP       0562737 B1    6/1998

*Primary Examiner* — Huan Hoang
*Assistant Examiner* — Minh Dinh
(74) *Attorney, Agent, or Firm* — DLA Piper LLP (US)

(57) ABSTRACT

A memory device and method of erasing same that includes a substrate of semiconductor material and a plurality of memory cells formed on the substrate and arranged in an array of rows and columns. Each of the memory cells includes spaced apart source and drain regions in the substrate, with a channel region in the substrate extending there between, a floating gate disposed over and insulated from a first portion of the channel region which is adjacent the source region, a select gate disposed over and insulated from a second portion of the channel region which is adjacent the drain region, and a program-erase gate disposed over and insulated from the source region. The program-erase gate lines alone or in combination with the select gate lines, or the source lines, are arranged in the column direction so that each memory cell can be individually programmed, read and erased.

5 Claims, 6 Drawing Sheets

(56) References Cited

U.S. PATENT DOCUMENTS

| | | |
|---|---|---|
| 5,469,397 A | 11/1995 | Hoshino |
| 5,643,814 A | 7/1997 | Chung |
| 6,747,310 B2 | 6/2004 | Fan |
| 2003/0034510 A1 | 2/2003 | Liu |
| 2004/0125655 A1 | 7/2004 | Tsai |
| 2005/0087892 A1 | 4/2005 | Hsu |
| 2007/0171756 A1 | 7/2007 | Lambrache |
| 2014/0269062 A1 | 9/2014 | Do |
| 2015/0106315 A1 | 4/2015 | Birdwell |
| 2015/0213898 A1 | 7/2015 | Do |
| 2015/0262055 A1 | 9/2015 | Akopyan |
| 2016/0042790 A1 | 2/2016 | Tran |
| 2016/0133639 A1 | 5/2016 | Tran |
| 2017/0337466 A1 | 11/2017 | Bayat |
| 2017/0337971 A1* | 11/2017 | Tran ........................ G11C 16/14 |

\* cited by examiner

ARRAY OF THREE-GATE FLASH MEMORY CELLS WITH INDIVIDUAL MEMORY CELL READ, PROGRAM AND ERASE

RELATED APPLICATIONS

This application is a continuation of U.S. patent application Ser. No. 15/593,231, filed May 11, 2017, which claims the benefit of U.S. Provisional Application No. 62/337,582 filed on May 17, 2016.

FIELD OF THE INVENTION

The present invention relates to non-volatile memory arrays.

BACKGROUND OF THE INVENTION

Split gate non-volatile memory cells having three conductive gates, and arrays of such cells, are known. For example, U.S. Pat. No. 7,315,056 ("the '056 patent") discloses an array of split gate non-volatile memory cells, and is incorporated herein by reference for all purposes. The memory cell is shown in FIG. 1. Each memory cell 10 includes source and drain regions 14/16 formed in a semiconductor substrate 12, with a channel region 18 there between. A floating gate 20 is formed over and insulated from (and controls the conductivity of) a first portion of the channel region 18, and over a portion of the source region 14. A select (word line) gate 28 has a first portion 28a that is disposed over and insulated from (and controls the conductivity of) a second portion of the channel region 18, and a second portion 28b that extends up and over the floating gate 20. A program/erase gate 30 has a first portion disposed over the source region 14 and is laterally adjacent to the floating gate 20, and a second portion 30b that extends up and over the floating gate 20.

The memory cell is erased (where electrons are removed from the floating gate) by placing a high positive voltage on the PE gate 30, which causes electrons on the floating gate 20 to tunnel through the intermediate insulation from the floating gate 20 to the PE gate 30 via Fowler-Nordheim tunneling.

The memory cell is programmed (where electrons are placed on the floating gate) by placing a positive voltage on the select gate 28, and a positive voltage on the source 14 and a positive voltage on the PE gate 30. Electron current will flow from the drain 16 towards the source 14. The electrons will accelerate and become heated when they reach the gap between the select gate 28 and the floating gate 20. Some of the heated electrons will be injected through the gate oxide onto the floating gate 20 due to the attractive electrostatic force from the floating gate 20.

The memory cell is read by placing positive read voltages on the drain 16 and select gate 28 (which turns on the channel region under the select gate). If the floating gate 20 is positively charged (i.e. erased of electrons and positively coupled to the source 14), then the portion of the channel region under the floating gate 20 is turned on as well, and current will flow across the channel region 18, which is sensed as the erased or "1" state. If the floating gate 20 is negatively charged (i.e. programmed with electrons), then the portion of the channel region under the floating gate 20 is mostly or entirely turned off, and current will not flow (or there will be little flow) across the channel region 18, which is sensed as the programmed or "0" state.

Exemplary operating voltages can be:

TABLE 1

| Operation | Select Gate (28) | Drain (16) | PE Gate (30) | Source (14) |
|---|---|---|---|---|
| Erase | 0 | 0 | 10-12 Volts | 0 |
| Program | 1-2 Volts | ~1 µA | 4-6 Volts | 6-8 Volts |
| Read | 1.5-3.3 Volts | 0.5-1.0 Volts | 0 | 0 |

The architecture of the memory array is shown in FIG. 2. The memory cells 10 are arranged in rows and columns. In each column, the memory cells are arranged end to end in mirror fashion, so that they are formed as pairs of memory cells each sharing a common source region 14, and each adjacent set of memory cell pairs sharing a common drain region 16. All the source regions 14 for any given row of memory cells are electrically connected together by a source line 14a. All the drain regions 16 for any given column of memory cells are electrically connected together by a bit line 16a. All the select gates 28 for any given row of memory cells are electrically connected together by a select gate line 28a. All the PE gates 30 for any given row of memory cells are electrically connected together by a PE gate line 30a. Therefore, while the memory cells can be individually programmed and read, memory cell erasure is performed by pairs of rows (each pair of rows of memory cells sharing PE gates 30 are erased together, by the application of a high voltage on the PE gate line 30a). If a particular memory cell is to be erased, all the memory cells in the two rows are also erased.

Recently, new applications for split gate non-volatile memory cells have been developed that require true single bit operation (i.e. each memory cell can be individually programmed, read, and erased, without any interference from or disturbing the programming state of adjacent memory cells). Therefore, there is a need for an array of split gate non-volatile memory cells having three conductive gates which can be independently programmed, read and erased.

BRIEF SUMMARY OF THE INVENTION

The aforementioned problems and needs are addressed by a memory device that comprises a substrate of semiconductor material and a plurality of memory cells formed on the substrate and arranged in an array of rows and columns. Each of the memory cells includes spaced apart source and drain regions in the substrate, with a channel region in the substrate extending there between, a floating gate disposed over and insulated from a first portion of the channel region which is adjacent the source region, a select gate disposed over and insulated from a second portion of the channel region which is adjacent the drain region, and a program-erase gate disposed over and insulated from the source region. Each of the rows of memory cells includes a source line that electrically connects together all the source regions for the row of memory cells. Each of the columns of memory cells includes a bit line that electrically connects together all the drain regions for the column of memory cells. Each of the rows of memory cells includes a select gate line that electrically connects together all the select gates of the memory cells for the row of memory cells. Each of the columns of memory cells includes a program-erase gate line that electrically connects together all the program-erase gates of the memory cells for the column of memory cells.

Other objects and features of the present invention will become apparent by a review of the specification, claims and appended figures.

DETAILED DESCRIPTION OF THE INVENTION

The present invention involves new architecture configurations for arrays of 3-gate, split-gate, non-volatile memory cells that provide unique (random order) programming, reading and erasing of single memory cells (i.e., true single bit operation).

Figure 1:
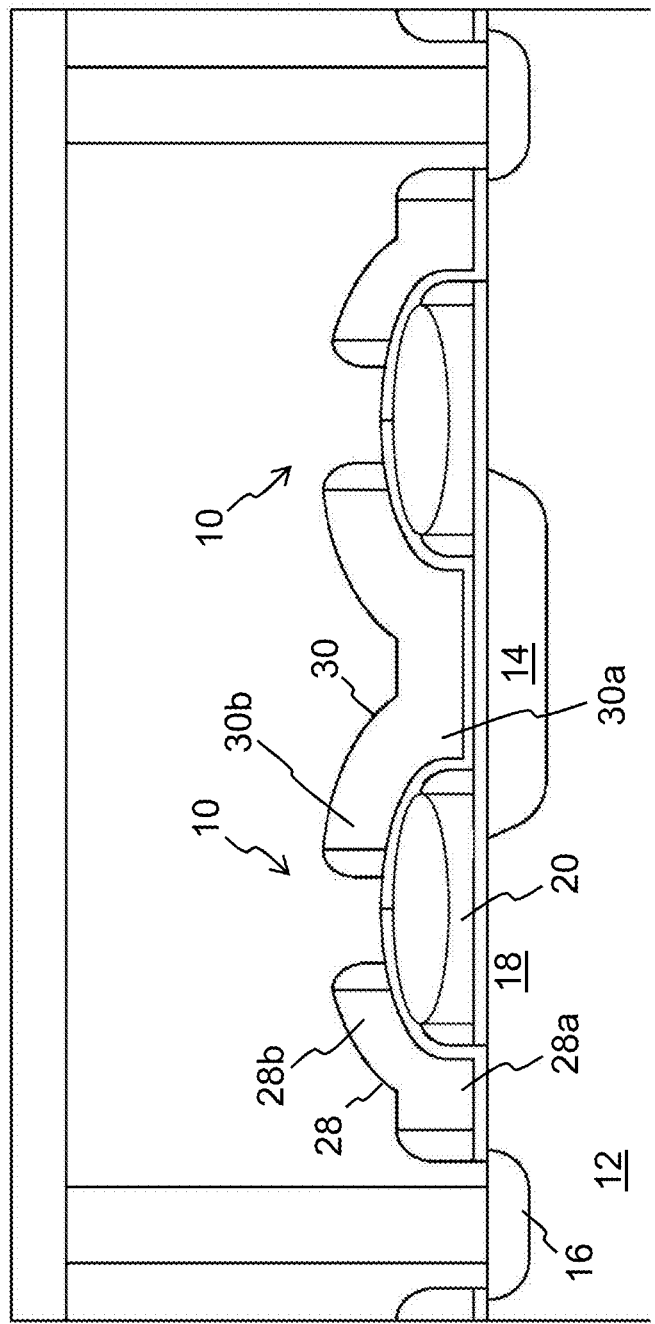
FIG. 1 is a side cross sectional view of conventional 3-gate non-volatile memory cell.
Figure 2:
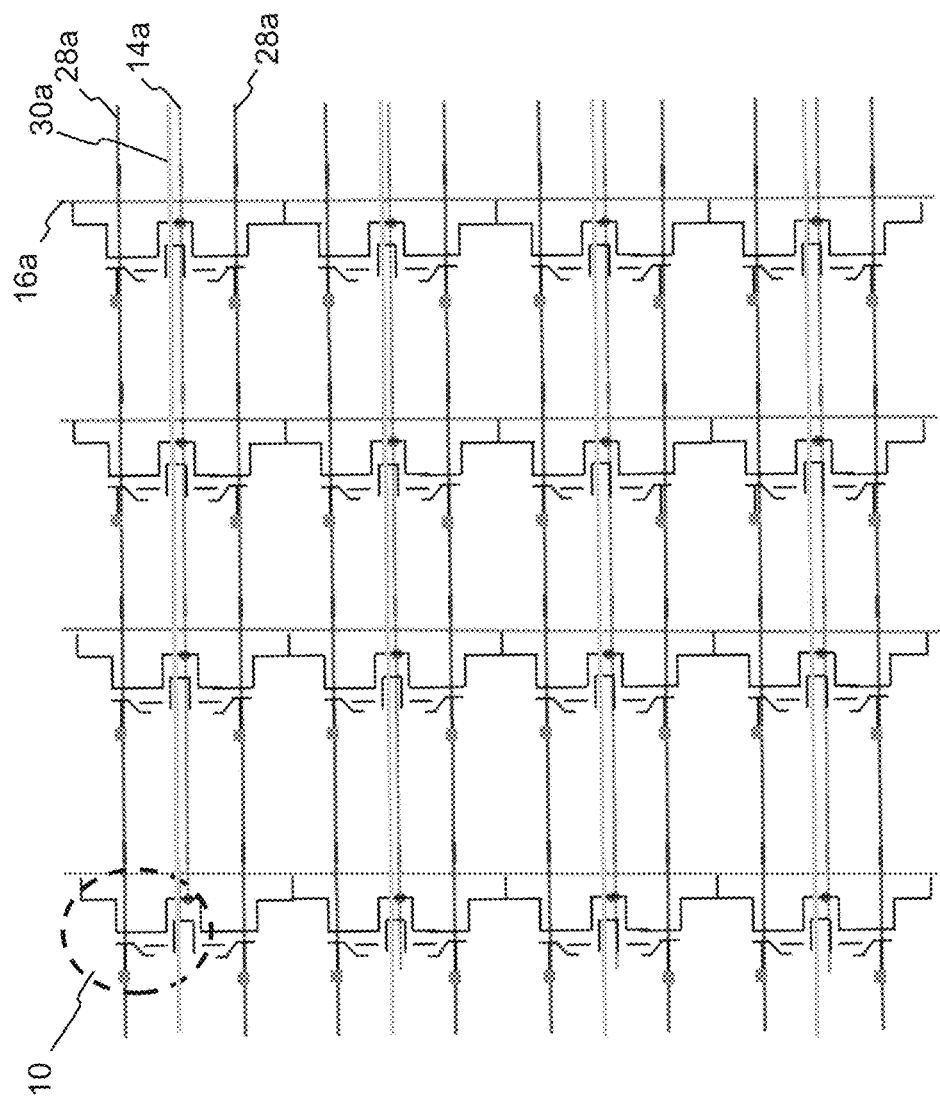
FIG. 2 is a diagram illustrating a conventional array architecture for the 3-gate memory cell of FIG. 1.
Figure 3:
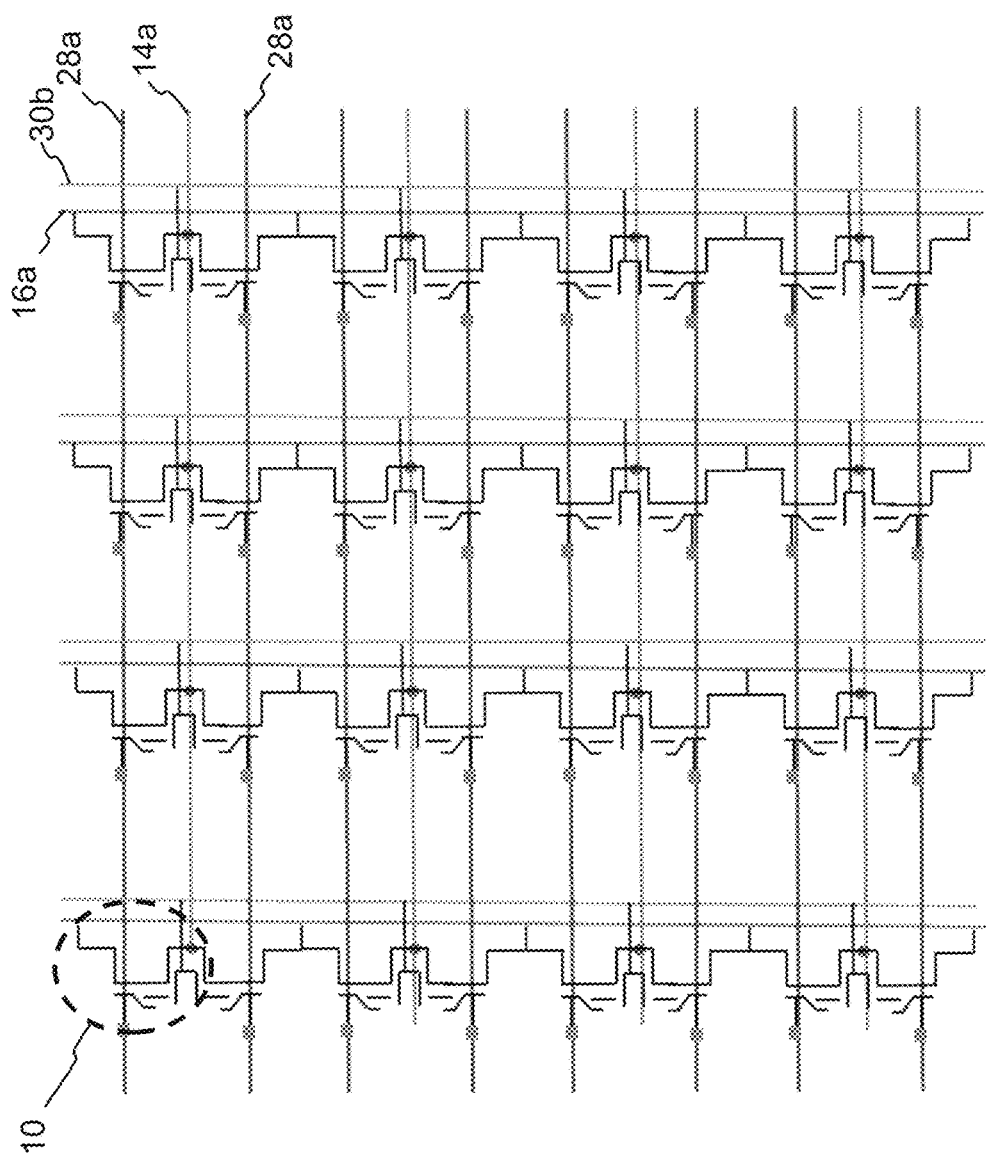
FIG. 3 is a schematic drawing of the 3-gate non-volatile memory cell architecture of the present invention.

For the three-gate cell of FIG. 1, the memory array architecture that provides true single bit operation is shown in FIG. 3. The main difference between the 3-gate single bit operation architecture of FIG. 3, and the conventional 3-gate architecture discussed above with respect to FIG. 2, is that the horizontal PE gate lines 30a (one for each pair of memory cell pairs) have been replaced with vertical PE gate lines 30b. Specifically, each column of memory cells includes a PE gate line 30b that electrically connects together all the PE gates 30 for the column of memory cells. By reorienting the PE gate lines in this manner, any memory cell in the array can be individually programmed, erased and read. Exemplary operational voltages to erase, program or read any given target memory cell are shown in Table 2 below:

TABLE 2

|  | PE (30) | | WL (28) | | BL (16) | | SL (14a) | |
| --- | --- | --- | --- | --- | --- | --- | --- | --- |
|  | sel | unsel | sel | unsel | sel | unsel | sel | unsel |
| Erase | VPEGerase | gnd | gnd | gnd | gnd | gnd/VBLerinh | gnd | VSLerinh |
| Program | VPEGprg/gnd | gnd | VWLprg | gnd | Iprog | VBLprginh | VSprg | gnd |
| Read | gnd | gnd | VWLrd | gnd | VBLrd | gnd | VSrd | float/gnd |

(sel = line that intersects target memory cell)
(unsel = line that does not intersect target memory cell).

Numerical (non-limiting) examples are shown in Table 3 below:

TABLE 3

| VPEGerase | 8-11.5 v |
| --- | --- |
| VSLerinh | 3-6 v |
| VBLerinh | 1-2.5 v |
| VPEGprg | 4-6 v |
| VWLprg | 0.8-1.2 v |
| VBLprginh | 1-2.5 v |

TABLE 3-continued

| Iprog | 1-3 ua |
| --- | --- |
| VSprg | 4-8 V |
| VWLrd | 0.4-2.5 V |
| VBLrd | 1-2 V |
| VSrd | 0-0.6 V |

During erase, only the selected cell will have a high voltage on its PE gate 30 in combination with its source region 14 being at ground, so that electrons will tunnel off the floating gate 20. Any unselected cells in the same column that have a high voltage applied to their PE gates 30 will also have an inhibit voltage applied to their source regions 14 that is sufficiently high to inhibit any tunneling of electrons off of the floating gate (i.e. the electrons will see positive voltages in two opposing directions).

Figure 4:
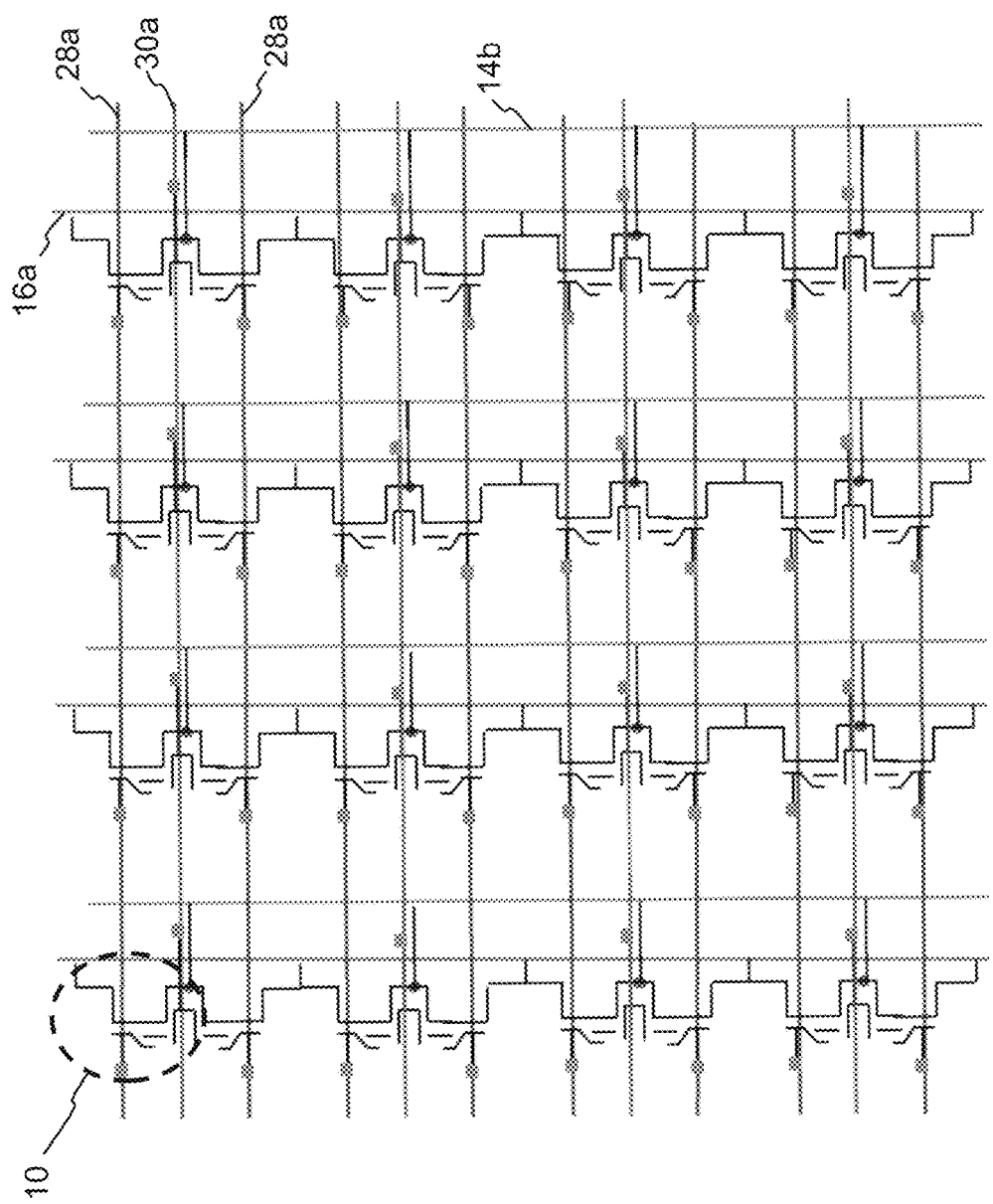
FIG. 4 is a schematic drawing of an alternate embodiment of the 3-gate non-volatile memory cell architecture of the present invention.

FIG. 4 illustrates an alternate embodiment of the 3-gate single bit operation architecture. The main difference between the 3-gate single bit operation architecture of FIG. 4, and the conventional 3-gate architecture discussed above with respect to FIG. 2, is that horizontal source lines 14a (one for each row) have been replaced with vertical source lines 14b (one for each column). Specifically, each column of memory cells includes a source line 14b electrically connecting together all the source regions 14 for all the memory cells 10 in that column. By reorienting the source lines in this manner, any memory cell in the array can be individually programmed, erased and read without adversely affecting the memory state of adjacent memory cells. The Table 2 operational values similarly apply to this embodiment.

Figure 5:
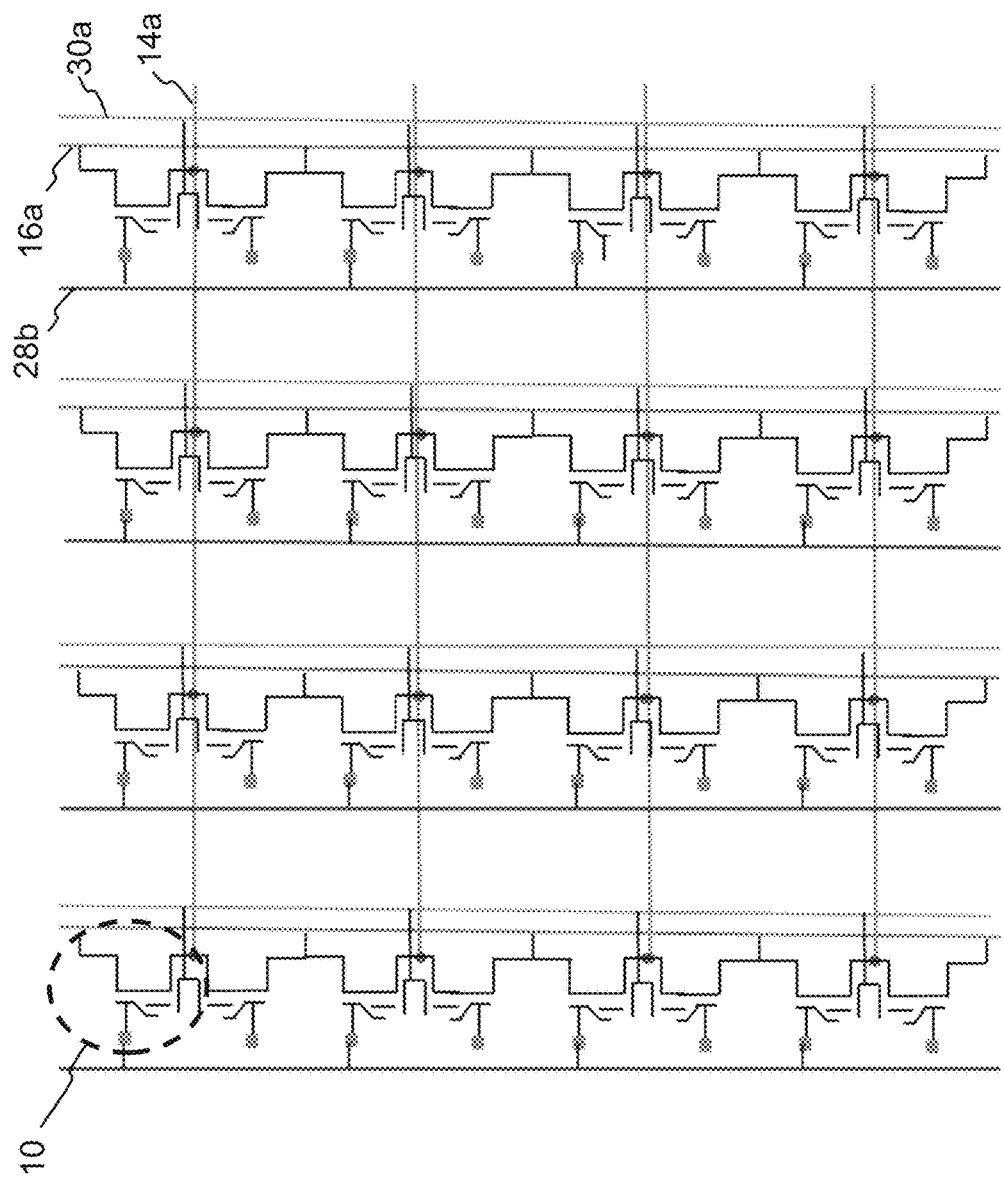
FIG. 5 is a schematic drawing of another alternate embodiment of the 3-gate non-volatile memory cell architecture of the present invention.

FIG. 5 illustrates another alternate embodiment of the 3-gate single bit operation architecture. The main difference between the 3-gate single bit operation architecture of FIG. 5, and the conventional 3-gate architecture discussed above with respect to FIG. 2, is that horizontal word lines 28a (one for each row) have been replaced with vertical word lines 28b (one for each column). Specifically, each column of memory cells includes a word line 28b electrically connecting together all the select gates 28 in the odd rows of memory cells for the column of memory cells (the even row select gates are not used). By reorienting the word lines in this manner, any memory cell in the array can be individually programmed, erased and read without adversely affecting the memory state of adjacent memory cells. The Table 2 operational values similarly apply to this embodiment. It should be noted that word line 28b can electrically connect to all the even row select gates instead of the odd row select gates.

Figure 6:
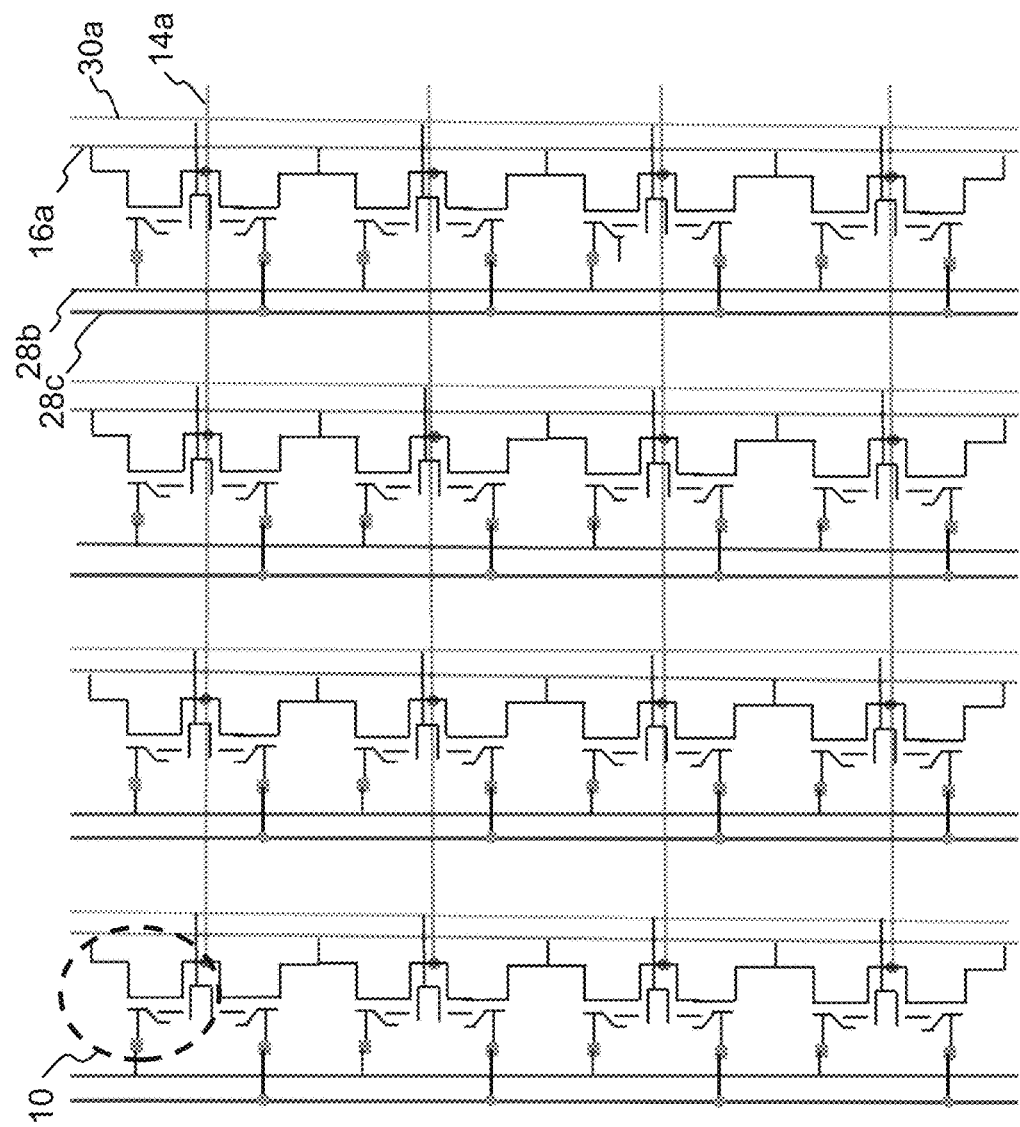
FIG. 6 is a schematic drawing of yet another alternate embodiment of the 3-gate non-volatile memory cell architecture of the present invention.

FIG. 6 illustrates yet another alternate embodiment of the 3-gate single bit operation architecture. The main difference between the 3-gate single bit operation architecture of FIG. 6, and the conventional 3-gate architecture discussed above with respect to FIG. 2, is that horizontal word lines 28a (one for each row) have been replaced with vertical word lines 28b and 28c for each column. Specifically, each column of memory cells includes a word line 28b electrically connecting together all the select gates 28 in the odd rows of memory cells for the column of memory cells, and a word line 28c electrically connecting together all the select gates 28 in the even rows of memory cells for the column of memory cells. By reorienting the word lines in this manner, any memory cell in the array can be individually programmed, erased and read without adversely affecting the memory state of adjacent memory cells. The Table 2 operational values similarly apply to this embodiment.

It is to be understood that the present invention is not limited to the embodiment(s) described above and illustrated herein, but encompasses any and all variations falling within the scope of any claims. For example, references to the present invention herein are not intended to limit the scope of any claim or claim term, but instead merely make reference to one or more features that may be covered by one or more claims. Materials, processes and numerical examples described above are exemplary only, and should not be deemed to limit the claims. Lastly, single layers of material could be formed as multiple layers of such or similar materials, and vice versa.

It should be noted that, as used herein, the terms "over" and "on" both inclusively include "directly on" (no intermediate materials, elements or space disposed therebetween) and "indirectly on" (intermediate materials, elements or space disposed therebetween). Likewise, the term "adjacent" includes "directly adjacent" (no intermediate materials, elements or space disposed therebetween) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements therebetween, as well as forming the element indirectly on the substrate with one or more intermediate materials/elements there between.

What is claimed is:

1. A memory device, comprising:
a substrate of semiconductor material;
a plurality of memory cells formed on the substrate and arranged in an array of rows and columns;
each of the memory cells includes:
  spaced apart source and drain regions in the substrate, with a channel region in the substrate extending there between,
  a floating gate disposed over and insulated from a first portion of the channel region which is adjacent the source region,
  a select gate disposed over and insulated from a second portion of the channel region which is adjacent the drain region, and
  a program-erase gate disposed over and insulated from the source region;
each of the rows of memory cells includes a source line that electrically connects together all the source regions for the row of memory cells;
each of the columns of memory cells includes a bit line that electrically connects together all the drain regions for the column of memory cells;
each of the rows of memory cells includes a select gate line that electrically connects together all the select gates of the memory cells for the row of memory cells; and
each of the columns of memory cells includes a program-erase gate line that electrically connects together all the program-erase gates of the memory cells for the column of memory cells.

2. The memory device of claim 1, wherein for each of the memory cells, the floating gate extends over and is insulated from a portion of the source region.

3. The memory device of claim 1, wherein for each of the memory cells, the select gate has a first portion laterally adjacent to the floating gate and a second portion that extends up and over the floating gate.

4. The memory device of claim 1, wherein for each of the memory cells, the program-erase gate has a first portion laterally adjacent to the floating gate and a second portion that extends up and over the floating gate.

5. The memory device of claim 1, wherein:
the memory cells are arranged in pairs of the memory cells; and
each of the pairs of memory cells shares one of the source regions and one of the source lines.

* * * * *